(12) United States Patent
Seder et al.

(10) Patent No.: US 11,067,721 B2
(45) Date of Patent: *Jul. 20, 2021

(54) TEXTURED SELF-CLEANING FILM SYSTEM AND METHOD OF FORMING SAME

(71) Applicant: GM GLOBAL TECHNOLOGY OPERATIONS LLC, Detroit, MI (US)

(72) Inventors: Thomas A. Seder, Fraser, MI (US); James A. Carpenter, Rochester Hills, MI (US); Gayatri V. Dadheech, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,056

(22) Filed: Mar. 4, 2020

(65) Prior Publication Data

US 2020/0200946 A1 Jun. 25, 2020

Related U.S. Application Data

(63) Continuation of application No. 15/598,838, filed on May 18, 2017, now Pat. No. 10,754,067.

(51) Int. Cl.
*G02B 1/115* (2015.01)
*B01J 21/06* (2006.01)
(Continued)

(52) U.S. Cl.
CPC ............ *G02B 1/115* (2013.01); *B01J 21/063* (2013.01); *B01J 23/50* (2013.01); *B01J 35/004* (2013.01);
(Continued)

(58) Field of Classification Search
CPC ......... B01J 21/063; B01J 35/004; C09D 5/00; C09D 5/1681; G02B 1/11; G02B 1/18;
(Continued)

(56) References Cited

U.S. PATENT DOCUMENTS

| 4,047,804 A | 9/1977 | Stephens |
| 4,449,050 A | 5/1984 | Kamhi |

(Continued)

FOREIGN PATENT DOCUMENTS

| CN | 201035171 Y | 3/2008 |
| CN | 101422974 A | 5/2009 |

(Continued)

OTHER PUBLICATIONS

Dadheech, Gayatri V. et al., U.S. Appl. No. 16/742,491, filed Jan. 14, 2020 entitled "Self-Cleaning Film System and Method of Forming Same," 31 pages.

(Continued)

*Primary Examiner* — Frank J Vineis
*Assistant Examiner* — Laura B Figg
(74) *Attorney, Agent, or Firm* — Harness, Dickey & Pierce, P.L.C.

(57) ABSTRACT

A self-cleaning film system includes a substrate and an anti-reflection film disposed on the substrate. The anti-reflection film includes a first sheet formed from titanium dioxide, a second sheet formed from silicon dioxide and disposed on the first sheet, and a third sheet formed from titanium dioxide and disposed on the second sheet. The system includes a self-cleaning film disposed on the anti-reflection film and including a monolayer disposed on the third sheet and formed from a fluorinated material selected from the group consisting of fluorinated organic compounds, fluorinated inorganic compounds, and combinations thereof. The self-cleaning film includes a first plurality of regions (Continued)

disposed within the monolayer such that each of the first plurality of regions abuts and is surrounded by the fluorinated material and includes a photocatalytic material.

20 Claims, 2 Drawing Sheets

(51) Int. Cl.
|  |  |
|---|---|
| B01J 23/50 | (2006.01) |
| B01J 35/00 | (2006.01) |
| C23C 14/08 | (2006.01) |
| C23C 14/35 | (2006.01) |
| C23C 14/58 | (2006.01) |
| G02B 1/18 | (2015.01) |
| C23C 14/06 | (2006.01) |
| C23C 14/10 | (2006.01) |
| B08B 17/06 | (2006.01) |
| B01J 37/34 | (2006.01) |

(52) U.S. Cl.
CPC ........... *B01J 35/0006* (2013.01); *B01J 37/34* (2013.01); *B08B 17/065* (2013.01); *C23C 14/0605* (2013.01); *C23C 14/083* (2013.01); *C23C 14/086* (2013.01); *C23C 14/10* (2013.01); *C23C 14/35* (2013.01); *C23C 14/5826* (2013.01); *C23C 14/5846* (2013.01); *C23C 14/5873* (2013.01); *G02B 1/18* (2015.01)

(58) Field of Classification Search
CPC ... G02B 27/0006; B08B 17/02; B08B 17/065; B82Y 30/00
See application file for complete search history.

(56) References Cited

U.S. PATENT DOCUMENTS

| | | | |
|---|---|---|---|
| 4,536,179 A | 8/1985 | Anderson et al. | |
| 4,915,981 A | 4/1990 | Traskos et al. | |
| 6,055,085 A | 4/2000 | Nakashima et al. | |
| 6,101,266 A | 8/2000 | Laskowski et al. | |
| 6,406,158 B1 | 6/2002 | Ohkawa | |
| 6,797,974 B2 | 9/2004 | Philipp et al. | |
| 7,359,543 B2 | 4/2008 | Tsuji et al. | |
| 8,047,426 B2 | 11/2011 | Haycock et al. | |
| 9,044,574 B2 | 6/2015 | Yoshimachi | |
| 9,259,513 B2 | 2/2016 | Bedwell et al. | |
| 9,468,088 B2 | 10/2016 | Nah | |
| 9,611,016 B2 | 4/2017 | Salters et al. | |
| 9,861,974 B2 | 1/2018 | Dadheech et al. | |
| 10,052,622 B2 | 8/2018 | Dadheech et al. | |
| 10,195,602 B2 | 2/2019 | Dadheech et al. | |
| 10,274,647 B2 | 4/2019 | Seder et al. | |
| 10,429,641 B2 | 10/2019 | Carpenter et al. | |
| 10,533,249 B2 | 1/2020 | Dadheech et al. | |
| 10,556,231 B2 | 2/2020 | Dadheech et al. | |
| 10,569,263 B2 | 2/2020 | Dadheech et al. | |
| 10,583,428 B2 | 3/2020 | Seder et al. | |
| 10,754,067 B2 | 8/2020 | Seder et al. | |
| 2005/0186871 A1 | 8/2005 | Hockaday | |
| 2005/0191505 A1* | 9/2005 | Akarsu | B82Y 30/00 428/469 |
| 2006/0150862 A1* | 7/2006 | Zhao | A61L 29/103 106/286.1 |
| 2007/0237943 A1* | 10/2007 | Wakizaka | C09D 5/14 428/328 |
| 2008/0053308 A1 | 3/2008 | Marzolin et al. | |
| 2009/0045617 A1 | 2/2009 | Lawandy et al. | |
| 2009/0130608 A1 | 5/2009 | Irving et al. | |
| 2009/0196791 A1 | 8/2009 | Ogata | |
| 2009/0267015 A1 | 10/2009 | Ogata | |
| 2010/0028604 A1* | 2/2010 | Bhushan | B08B 17/065 428/156 |
| 2010/0128965 A1 | 5/2010 | Blair | |
| 2011/0200656 A1 | 8/2011 | Olsson | |
| 2011/0220855 A1 | 9/2011 | Weir et al. | |
| 2013/0087374 A1 | 4/2013 | Nah | |
| 2014/0083473 A1 | 3/2014 | Lawandy | |
| 2014/0147654 A1* | 5/2014 | Walther | C23C 18/1245 428/312.6 |
| 2015/0238644 A1 | 8/2015 | Sung et al. | |
| 2016/0107204 A1 | 4/2016 | Lawandy | |
| 2017/0056871 A1 | 3/2017 | Dadheech et al. | |
| 2018/0154345 A1 | 6/2018 | Dadheech et al. | |
| 2018/0318820 A1 | 11/2018 | Dadheech et al. | |
| 2018/0320023 A1 | 11/2018 | Dadheech et al. | |
| 2018/0333709 A1 | 11/2018 | Seder et al. | |
| 2018/0333710 A1 | 11/2018 | Dadheech et al. | |
| 2018/0333711 A1 | 11/2018 | Dadheech et al. | |
| 2018/0334742 A1 | 11/2018 | Dadheech et al. | |
| 2018/0335548 A1 | 11/2018 | Seder et al. | |
| 2018/0348509 A1 | 12/2018 | Carpenter et al. | |
| 2019/0369389 A1 | 12/2019 | Carpenter et al. | |
| 2020/0147598 A1 | 5/2020 | Dadheech et al. | |

FOREIGN PATENT DOCUMENTS

| | | |
|---|---|---|
| CN | 101868762 A | 10/2010 |
| CN | 102998723 A | 3/2013 |
| CN | 103241961 A | 8/2013 |
| CN | 103740292 A | 4/2014 |
| CN | 103950248 A | 7/2014 |
| CN | 105038438 A | 11/2015 |
| CN | 106477901 A | 3/2017 |
| CN | 106633158 A | 5/2017 |
| CN | 107083184 A | 8/2017 |
| CN | 108948889 A | 12/2018 |
| CN | 108949031 A | 12/2018 |
| CN | 108949050 A | 12/2018 |
| CN | 108953597 A | 12/2018 |
| CN | 108953598 A | 12/2018 |
| CN | 108976873 A | 12/2018 |
| DE | 102018111826 A1 | 11/2018 |
| DE | 102018111827 A1 | 11/2018 |
| DE | 102018111828 A1 | 11/2018 |
| DE | 102018111830 A1 | 11/2018 |
| DE | 102018111831 A1 | 11/2018 |
| DE | 102018112987 A1 | 12/2018 |
| JP | S63308920 A | 12/1988 |
| KR | 20160012190 A | 2/2016 |
| WO | 2005077556 A1 | 8/2005 |
| WO | 2011123373 A1 | 10/2011 |
| WO | 2015194200 A1 | 12/2015 |

OTHER PUBLICATIONS

Science Mission Directorate, "Visible Light," NASA Science 2010, National Aeronautics and Space Administration; <http://science.nasa.gov/ems/09_visiblelight>.

First Office Action for Chinese Patent Application No. 201810443424.3 dated Oct. 9, 2019 with English language machine translation, 11 pages.

First Office Action for Chinese Patent Application No. 201810440683.0 dated Oct. 18, 2019 with English language machine translation, 14 pages.

First Office Action for Chinese Patent Application No. 201810465452.5 dated Feb. 3, 2020 with English language machine translation, 21 pages.

First Office Action for Chinese Patent Application No. 201810440411.0 dated Mar. 4, 2020 with English language machine translation, 21 pages.

First Office Action for Chinese Patent Application No. 201810435135.9 dated Mar. 12, 2020 with English language machine translation, 18 pages.

Xin, Zhong et al., "Research progress of fabrication and application of superamphiphobic surface," Chemical Industry and Engineering Progress, 2, pp. 447-455, 478 (2015) (Abstract Only).

(56) References Cited

OTHER PUBLICATIONS

First Office Action for Chinese Patent Application No. 201810437022.2 dated Jun. 3, 2020 with English language machine translation, 16 pages.
Second Office Action for Chinese Patent Application No. 201810443424.3 dated Jun. 28, 2020 with English language machine translation, 14 pages.
Second Office Action for Chinese Patent Application No. 201810465452.5 dated Aug. 5, 2020 with English language machine translation, 10 pages.

* cited by examiner

TEXTURED SELF-CLEANING FILM SYSTEM AND METHOD OF FORMING SAME

CROSS-REFERENCE TO RELATED APPLICATIONS

This application is a continuation of U.S. patent application Ser. No. 15/598,838 filed on May 18, 2017, which issued as U.S. Pat. No. 10,754,067 on Aug. 25, 2020. The entire disclosure of the above application is incorporated herein by reference.

INTRODUCTION

The disclosure relates to a self-cleaning film system and to a method of forming the self-cleaning film system.

Devices, such as display systems, are often designed to be touched by an operator. For example, a vehicle may include a display system that presents information to an operator via a touchscreen. Similarly, an automated teller machine or kiosk may include a display system that is activated by touch.

Other devices, such as cameras and eyeglasses, generally include a lens surface which may be inadvertently touched by an operator during use. Further, other devices such as vehicles, windows, mirrors, appliances, cabinetry, furniture, cellular telephones, fingerprint scanners, sensors, copiers, medical instruments, and countertops may also include one or more surfaces which may be touched by an operator. Therefore, during use, an operator may deposit fingerprints and/or oils onto such devices and surfaces.

SUMMARY

A self-cleaning film system includes a substrate and an anti-reflection film disposed on the substrate. The anti-reflection film includes a first sheet formed from titanium dioxide, a second sheet formed from silicon dioxide and disposed on the first sheet, and a third sheet formed from titanium dioxide and disposed on the second sheet. The self-cleaning film system also includes a self-cleaning film disposed on the anti-reflection film and including a monolayer disposed on the third sheet and formed from a fluorinated material selected from the group consisting of fluorinated organic compounds, fluorinated inorganic compounds, and combinations thereof. The self-cleaning film also includes a first plurality of regions disposed within the monolayer such that each of the first plurality of regions abuts and is surrounded by the fluorinated material, wherein each of the first plurality of regions includes a photocatalytic material.

In one aspect, the self-cleaning film may have a first surface and a second surface spaced opposite the first surface and abutting the anti-reflection film. The first surface may be substantially free from squalene and water.

The substrate may have a proximal surface abutting the anti-reflection film, a distal surface spaced opposite the proximal surface, a first edge connecting the proximal surface and the distal surface, and a second edge spaced opposite the first edge.

In another aspect, the self-cleaning film system may further include a light source disposed adjacent the first edge and configured for emitting electromagnetic radiation. The electromagnetic radiation may have a wavelength of from 400 nm to 100 nm. Alternatively, the electromagnetic radiation may have a wavelength of from 740 nm to 380 nm.

The self-cleaning film may define a contact angle with water of greater than 140°. The photocatalytic material may be titanium dioxide and may be present in a rutile form. In another aspect, the photocatalytic material may be titanium dioxide and may be present in an anatase form. Alternatively, the photocatalytic material may be titanium dioxide and may be present as a combination of the rutile form and the anatase form.

In an additional aspect, the photocatalytic material may be doped with silver. Alternatively, the self-cleaning film system may further include a second plurality of regions disposed within the monolayer such that each of the second plurality of regions abuts and is surrounded by the fluorinated material. Each of the second plurality of regions may include silver. In one aspect, the fluorinated material is fluorinated diamond-like carbon.

In yet another aspect, the monolayer may have a texture defined by a combination of a plurality of microstructures and a plurality of nanostructures.

In a further aspect, the anti-reflection film may further include a fourth layer disposed on the third layer and formed from silicon dioxide. The first sheet may have a first thickness, the second sheet may have a second thickness that is greater than the first thickness, and the third sheet may have a third thickness that is greater than the first thickness and the second thickness.

In another embodiment, a self-cleaning film system includes a substrate and an anti-reflection film disposed on the substrate. The anti-reflection film includes a first sheet formed from titanium dioxide, a second sheet formed from silicon dioxide and disposed on the first sheet, and a third sheet formed from titanium dioxide and disposed on the second sheet. The first sheet has a first thickness, the second sheet has a second thickness that is greater than the first thickness, and the third sheet has a third thickness that is greater than the first thickness and the second thickness. The self-cleaning film system also includes a self-cleaning film disposed on the anti-reflection film and including a monolayer disposed on the third sheet and formed from a fluorinated material selected from the group consisting of fluorinated organic compounds, fluorinated inorganic compounds, and combinations thereof. The monolayer has a texture defined by a plurality of microstructures spaced apart from one another along the monolayer and a plurality of nanostructures disposed on each of the plurality of microstructures. The self-cleaning film also includes a first plurality of regions disposed within the monolayer such that each of the first plurality of regions abuts and is surrounded by the fluorinated material, wherein each of the first plurality of regions includes a photocatalytic material.

In one aspect, each of the plurality of microstructures has a conical shape and a first height of from 0.5 μm to 2 μm and further wherein each of the plurality of nanostructures has a second height of from 1 nm to 4 nm. In another aspect, the anti-reflection film may have a fourth layer disposed on the third layer and formed from silicon dioxide.

A method of forming a self-cleaning film includes depositing an anti-reflection film on a substrate. The anti-reflection film includes a first sheet formed from titanium dioxide, a second sheet formed from silicon dioxide and disposed on the first sheet, a third sheet formed from titanium dioxide and disposed on the second sheet. The method further includes magnetron sputtering a self-cleaning film on the anti-reflection film. The self-cleaning film includes a monolayer disposed on the third sheet and formed from a fluorinated material selected from the group consisting of fluorinated organic compounds, fluorinated inorganic compounds, and combinations thereof. The self-cleaning film also includes a first plurality of regions disposed within the monolayer such that each of the first plurality of regions abuts and is surrounded by the fluorinated material. Each of the first plurality of regions includes a photocatalytic material. The method also includes, after magnetron sputtering, reactive ion etching the self-cleaning film with $SF_6$—$O_2$ gas to produce a texture defined by a plurality of microstructures spaced apart from one another along the monolayer and a plurality of nanostructures disposed on each of the plurality of microstructures.

In one aspect, reactive ion etching includes forming each of the plurality of microstructures to have a conical shape and a first height of from 0.5 μm to 2 μm and forming each of the plurality of nanostructures to have a second height of from 1 nm to 4 nm.

The above features and advantages and other features and advantages of the present disclosure are readily apparent from the following detailed description of the best modes for carrying out the disclosure when taken in connection with the accompanying drawings.

DETAILED DESCRIPTION

Figure 1:
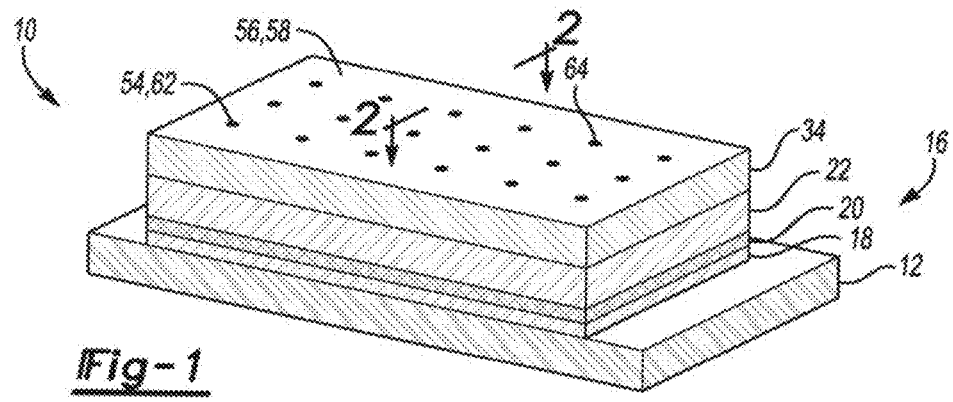
FIG. 1 is a schematic illustration of a perspective view of a self-cleaning film system.
Figure 3:
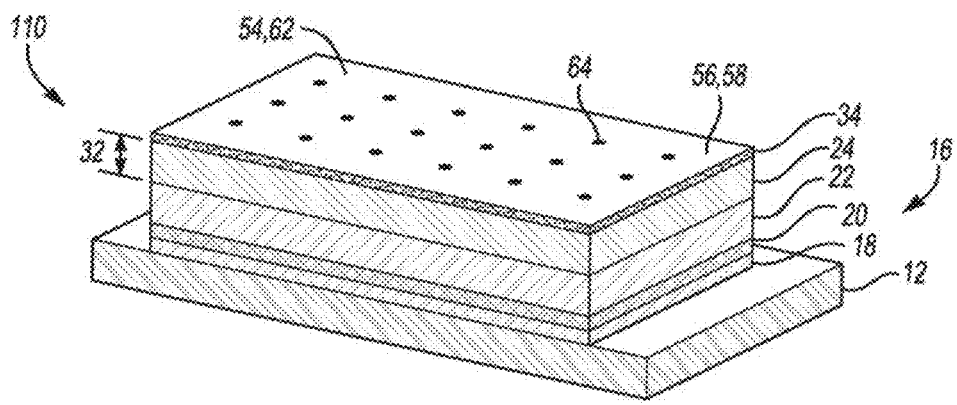
FIG. 3 is a schematic illustration of a perspective view of another embodiment of the self-cleaning film system of FIG. 1.

Example Referring to the Figures, wherein like reference numerals refer to like elements, a self-cleaning film system 10, 110 is shown generally in FIGS. 1 and 3. The self-cleaning film system 10, 110 may be suitable for applications in which an operator may touch and deposit fingerprints, oils, and/or other organic or carbon-based contaminants or pathogens 100 (FIG. 4) onto a screen, lens, or surface. More specifically, the self-cleaning film system 10, 110 may be useful for applications requiring a clean, substantially oil-free, fingerprint-free, and water-free screen, lens, or surface. That is, the self-cleaning film system 10, 110 may be useful for removing fingerprints and other organic contaminants 100 from such screens, lenses, or surfaces, and may be characterized as superoleophobic and superhydrophobic.

For example, the self-cleaning film system 10, 110 may be useful for automotive applications such as in-dash navigation systems which include a touchscreen, vehicle cameras which include a lens, vehicle mirrors, and vehicle interior surfaces. Alternatively, the self-cleaning film system 10, 110 may be useful for non-automotive applications such as, but not limited to, consumer electronics, cellular telephones, eyewear, personal protective equipment, appliances, furniture, kiosks, fingerprint scanners, medical devices, sensors, aircraft, and industrial vehicles.

Referring now to FIG. 1, the self-cleaning film system 10 includes a substrate 12. The substrate 12 may be formed from a vitreous, transparent material suitable for refracting visible light. For example, in one embodiment, the substrate 12 may be formed from silicon dioxide. In another example, the substrate 12 may be formed from a polycarbonate or other plastic. In one embodiment, the substrate 12 may be formed from cellulose triacetate. The substrate 12 may have a suitable substrate thickness 14 (FIG. 2) according to a desired application of the self-cleaning film system 10. For example, the substrate 12 may have a substrate thickness 14 of from 100 nm to 500 nm. In general, the substrate 12 may be configured as, by way of non-limiting examples, a screen of a display system, a lens of eyeglasses or goggles, a visor of a helmet, a surface of a refrigerator, a face of a cabinet, a door panel of a vehicle, a touchscreen of a kiosk, or as another surface or device that may be touched by an operator.

The self-cleaning film system 10 also includes an anti-reflection film 16 disposed on the substrate 12. The anti-reflection film 16 may be configured for reducing a reflection off the self-cleaning film system 10 and thereby improving an efficiency of the self-cleaning film system 10 since lost light in the system 10 may be minimized. As such, the self-cleaning film system 10 has both self-cleaning capabilities and comparatively low reflectance. The anti-reflection film 16 may be formed from an anti-reflection coating comprising alternating layers 18, 20, 22 of silicon dioxide and titanium dioxide. Each of the alternating sheets 18, 20, 22 of silicon dioxide and titanium dioxide may have a thickness 26, 28, 30 (FIG. 2) of from 5 nm to 125 nm. Further, the thickness 26, 28, 30 of each layer 18, 20, 22 may be optimized as set forth below to achieve broadband, spectral performance over wide incident angles.

For example, as described with reference to FIG. 2, the anti-reflection film 16 includes a first sheet 18 formed from titanium dioxide. The first sheet 18 may have a first thickness 26 of from 5 nm to 25 nm, e.g., 10 nm, and may have a comparatively low index of refraction. The anti-reflection film 16 includes a second sheet 20 formed from silicon dioxide and disposed on the first sheet 18. The second sheet 20 may have a second thickness 28 that is greater than the first thickness 26 and a comparatively high index of refraction. For example, the second thickness 28 may be from 20 nm to 45 nm, e.g., 33 nm. The anti-reflection film 16 includes a third sheet 22 formed from titanium dioxide and disposed on the second sheet 20. The third sheet 22 may have a third thickness 30 that is greater than the first thickness 26 and the second thickness 28 and a comparatively low index of refraction. The third thickness 30 may be from 50 nm to 200 nm, e.g., 100 nm. Although not shown, the anti-reflection film 16 may also include more than three layers or sheets 18, 20, 22. For example, in one embodiment described with reference to FIG. 3, the anti-reflection film 16 may include a fourth sheet 24 disposed on the third sheet 22. The fourth sheet 24 may be formed from silicon dioxide and may have a fourth thickness 32 of from 50 nm to 150 nm, e.g., 75 nm. The fourth sheet 24 may have a comparatively high index of refraction. In one embodiment, the fourth thickness 32 is less than the third thickness 30 and greater than the second thickness 28.

Figure 4:
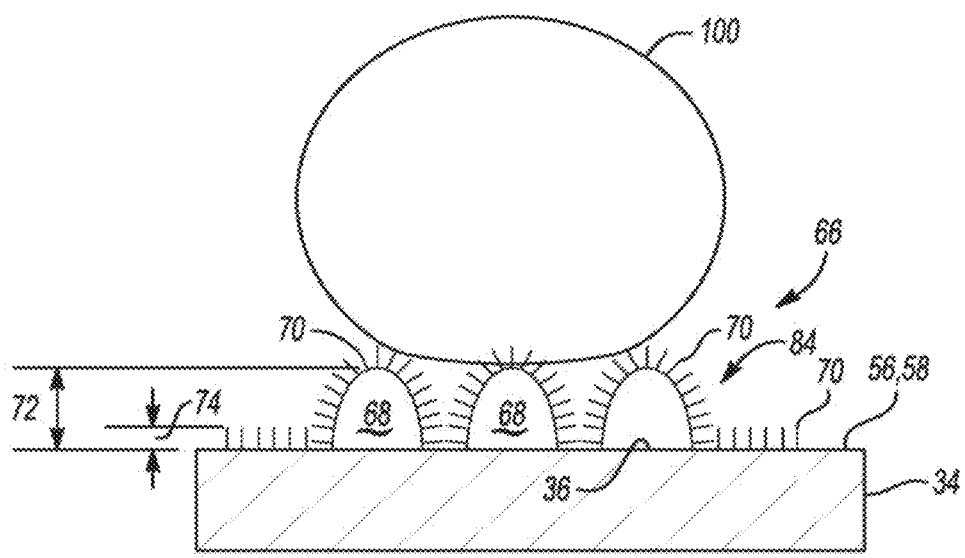
FIG. 4 is a schematic illustration of a magnified view of a surface of the self-cleaning film systems of FIGS. 1 and 3.

Referring again to FIG. 1, the self-cleaning film system 10 also includes a self-cleaning film 34 disposed on the anti-reflection film 16, e.g., chemically bonded to the anti-reflection film 16 as set forth in more detail below. The self-cleaning film 34 may be configured to cover and protect the substrate 12 and anti-reflection film 16 from fingerprints, oils, and organic contaminants 100 (FIG. 4). That is, the self-cleaning film 34 may be configured to cause fingerprints, oils, water, and organic contaminants 100 deposited on the self-cleaning film 34 to vanish, disappear, or vaporize so as to maintain a clean substrate 12 that is capable of displaying crisp images or reflections. In particular, in some embodiments, the self-cleaning film 34 may replace a topmost layer of the anti-reflection film 16 so as to integrate anti-reflection and self-cleaning capabilities into a single layer. As such, the self-cleaning film system 10 may minimize complexity and layer stack manufacturing and design. For example, tack time and material consumption costs may be comparatively lower for the self-cleaning film system 10.

More specifically, as described with reference to FIG. 2, the self-cleaning film 34 may have a first surface 36 and a second surface 38 spaced opposite the first surface 36. The second surface 38 may abut the anti-reflection film 16, and the first surface 36 may be substantially free from squalene and water, organic material, and/or other oils of fatty acids. As used herein, the terminology squalene refers to an organic compound having 30 carbon atoms and represented by the International Union of Pure and Applied Chemistry name (6E,10E,14E,18E)-2,6,10,15,19,23-hexamethyltetracosa-2,6,10,14,18,22-hexaene. In general, the self-cleaning film 34 may be characterized as a thin film and may have a film thickness 40 of, for example, from 5 nm to 30 nm, such as 10 nm.

The substrate 12 may also have a proximal surface 42 abutting the anti-reflection film 16 and a distal surface 44 spaced opposite the proximal surface 42. Therefore, the substrate 12, the anti-reflection film 16, and the self-cleaning film 34 are configured to transmit visible light through the proximal surface 42, the distal surface 44, the first surface 36, and the second surface 38. The substrate 12 may also have a first edge 46 connecting the proximal surface 42 and the distal surface 44, and a second edge 48 spaced opposite the first edge 46.

The self-cleaning film 34 may define a contact angle 50 with water of greater than or equal to 115°, e.g., greater than 140°. For example, the self-cleaning film 34 may define a contact angle 50 with water of greater than or equal to 150°. As such, water, oils, and contaminants 100 (FIG. 4) may effectively bead on and translate across the first surface 36. Stated differently, water, oils, and contaminants 100 may be mobile and effectively translate along the first surface 36 such that the self-cleaning film 34 is superoleophobic and superhydrophobic.

Figure 2:
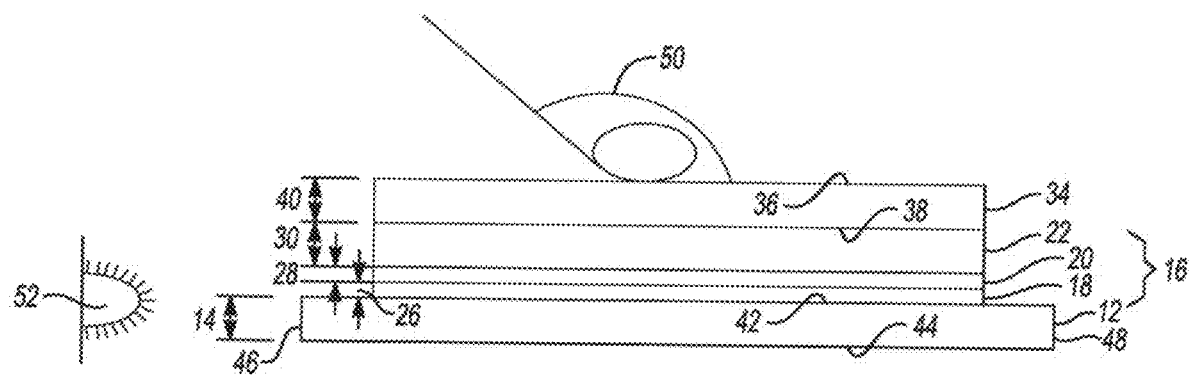
FIG. 2 is a schematic illustration of a cross-sectional view of the self-cleaning film system of FIG. 1 taken along section line 2-2.

Referring to FIG. 2, the self-cleaning film system 10 may further include a light source 52 disposed adjacent the first edge 46 and configured for emitting electromagnetic radiation. For example, the light source 52 may be an ultraviolet light-emitting diode and the electromagnetic radiation may have a wavelength of from 400 nm to 100 nm. Alternatively, the light source 52 may be an incandescent bulb or a visible light-emitting diode and the electromagnetic radiation may have a wavelength of from 740 nm to 380 nm.

The self-cleaning film 34 is formed from a self-cleaning coating composition. That is, the self-cleaning film 34 may mitigate fingerprint, water, and oil deposition, i.e., self-clean. The self-cleaning coating composition and self-cleaning film 34 include a photocatalytic material 54 (FIG. 1) and a fluorinated material 56 (FIG. 1), as set forth in more detail below.

Referring now to FIG. 1, the self-cleaning film 34 includes a monolayer 58 disposed on the third sheet 22 and formed from a fluorinated material 56 selected from the group consisting of fluorinated organic compounds, fluorinated inorganic compounds, and combinations thereof. As best shown in FIG. 1, the monolayer 58 may form a majority of the self-cleaning film 34 and may be characterized as a monolayer field. As used herein, the terminology monolayer refers to a layer having a thickness 40 (FIG. 2) of one molecule. That is, the monolayer 58 is one molecule thick and may be characterized as a thin layer. In one embodiment, the fluorinated material is fluorinated diamond-like carbon. In another embodiment, the fluorinated material is fluorinated tin (IV) oxide. The fluorinated material, i.e., fluorinated organic compounds, fluorinated inorganic compounds, and combinations thereof such as fluorinated diamond-like carbon or fluorinated tin (IV) oxide, provides the self-cleaning film 34 with superhydrophobicity, water-resistance, anti-microbial properties, anti-soiling properties, and scratch-resistance. The self-cleaning film 34 may also contribute to a clean air quality of an ambient environment in which the self-cleaning film 34 is used.

As shown in FIG. 1, the self-cleaning film 34 also includes a first plurality of regions 62 disposed within the monolayer 58 such that each of the first plurality of regions 62 abuts and is surrounded by the fluorinated material. That is, the first plurality of regions 62 may be situated within and along the monolayer 58. In one embodiment, the first plurality of regions 62 may be equally spaced apart from each other along the first surface 36. In other embodiments, the first plurality of regions 62 may be randomly spaced throughout the monolayer 58 along the first surface 36. In still other embodiments, the first plurality of regions 62 may be arranged in a pattern within the monolayer 58. The first plurality of regions 62 may be present in the self-cleaning film 34 in an amount of from about 10 parts by volume to about 85 parts by volume based on 100 parts by volume of the self-cleaning film 34, e.g., about 50 parts by volume based on 100 parts by volume of the self-cleaning film 34.

Each of the first plurality of regions 62 includes a photocatalytic material, such as titanium dioxide. The photocatalytic material 54 may provide the self-cleaning film 34 with self-cleaning capability. That is, the photocatalytic material 54 may oxidize and/or vaporize organic material, e.g., squalene, present on the first surface 36 of the self-cleaning film 34, as set forth in more detail below. In particular, the photocatalytic material 54 may be a light-activated photocatalyst upon exposure to, for example, visible or ultraviolet light.

Suitable photocatalytic materials 54 may include, but are not limited to, photo-oxidative semiconductors, semiconducting oxides, doped metal oxides, heterojunction materials, and combinations thereof.

In one embodiment, the photocatalytic material 54 may be titanium dioxide and may be present in the first plurality of regions 62 in a rutile form. Alternatively, the photocatalytic material 54 may be titanium dioxide and may be present in the first plurality of regions 62 in an anatase form, which may exhibit a comparatively higher photocatalytic activity than the rutile form. In other embodiments, the photocatalytic material 54 may be titanium dioxide and may be present in the first plurality of regions 62 as a combination of the rutile form and the anatase form. Further, the photocatalytic material 54 may be doped to form a functionalized photocatalytic material, e.g., functionalized titanium dioxide. For example, the functionalized photocatalytic material may be doped with a metal such as, but not limited to, chromium, cobalt, copper, vanadium, iron, silver, platinum, molybdenum, lanthanum, niobium, and combinations thereof. In one embodiment, the photocatalytic material 54 may be doped with silver. Alternatively, the functionalized photocatalytic material may be doped with a non-metal such as, but not limited to, nitrogen, sulfur, carbon, boron, potassium, iodine, fluorine, and combinations thereof.

The photocatalytic material 54 may be characterized as a nanoparticle and may have an average diameter measureable on a nanometer scale. Alternatively, the photocatalytic material 54 may be characterized as a particle and may have an average diameter measureable on a micrometer scale. Generally, the photocatalytic material 54 may be present in the self-cleaning film 34 in an amount of from about 2 parts by volume to about 35 parts by volume based on 100 parts by volume of the self-cleaning film 34.

In other non-limiting embodiments, the photocatalytic material 54 may include a semiconducting oxide such as, but not limited to, zinc oxide, bismuth, tin oxide, and combinations thereof. The semiconducting oxide may be selected to have a band gap separation suitable for a photocatalytic reaction, as set forth in more detail below.

As set forth above, in some embodiments, the self-cleaning film 34 may replace the topmost layer, e.g., the fourth sheet 24 (FIG. 3), of the anti-reflection film 16. Further, the fluorinated material 56 may have an index of refraction of from about 1.2 to about 1.6, e.g., from about 1.3 to about 1.5, according to the percentage of fluorine present in the fluorinated material. Consequently, the self-cleaning film system 10 may include a comparatively thicker monolayer 58 formed from the fluorinated material 56, which may in turn contribute to comparatively greater photocatalytic activity of the photocatalytic material 54. The fluorinated material 56 may also be transparent and have excellent durability. As such, for some embodiments, the fluorinated material may allow for replacement of the topmost layer, e.g., the fourth sheet 24, of the anti-reflection film 16.

In another embodiment, the self-cleaning film 34 may include a second plurality of regions 64 disposed within the monolayer 58 such that each of the second plurality of regions 64 abuts and is surrounded by the fluorinated material 56, wherein each of the second plurality of regions 64 includes silver.

That is, the second plurality of regions 64 may also be situated within and along the monolayer 58. In one embodiment, the second plurality of regions 64 may be equally spaced apart from each other along the first surface 36. In other embodiments, the second plurality of regions 64 may be randomly spaced throughout the monolayer 58 along the first surface 36. In still other embodiments, the second plurality of regions 64 may be arranged in a pattern within the monolayer 58. The second plurality of regions 64 may be present in the self-cleaning film 34 in an amount of from about 10 parts by volume to about 85 parts by volume based on 100 parts by volume of the self-cleaning film 34, e.g., about 25 parts by volume based on 100 parts by volume of the self-cleaning film 34.

The silver may be characterized as a nanoparticle and may have an average diameter measureable on a nanometer scale. Alternatively, the silver may be characterized as a particle and may have an average diameter measureable on a micrometer scale. Generally, the silver may be present in the self-cleaning film 34 in an amount of from about 2 parts by volume to about 35 parts by volume based on 100 parts by volume of the self-cleaning film 34. The silver may provide the self-cleaning film 34 with anti-microbial and air-purifying properties and soil-resistance. For example, the silver may disrupt microbe cellular function. In particular, the silver may contribute to phospholipid decomposition such that a microbe cell well cannot undergo respiration.

Referring now to FIG. 4, the monolayer 58 may have a texture 66 defined by a combination of a plurality of microstructures 68 and a plurality of nanostructures 70. More specifically, the plurality of microstructures 68 may be spaced apart from one another along the monolayer 58, and the plurality of nanostructures 70 may be disposed on each of the plurality of microstructures 68. Further, each of the plurality of microstructures 68 may have a conical shape and a first height 72 of from 0.5 μm to 2 μm, e.g., 1 μm. Each of the plurality of nanostructures 70 may have a second height 74 of from 1 nm to 4 nm, e.g., 2 nm. The texture 66 defined by the combination of the plurality of microstructures 68 and the plurality of nanostructures 70 may form a cauliflower-like or raspberry-like, non-smooth first surface 36. In one specific embodiment, the monolayer 58 may be characterized as a textured diamond-like carbon. The plurality of nanostructures 70 disposed on the plurality of microstructures 68 may form a hierarchical, stochastic structure or texture 66 that contributes to the self-cleaning capabilities of the self-cleaning film 34. The plurality of microstructures 68 and the plurality of nanostructures 70 together may increase the contact angle 50 (FIG. 2) with water and oils such that the self-cleaning film 34 exhibits excellent soil-resistance and minimal wettability.

That is, the contact angle 50 may be inversely related to a surface energy of the first surface 36. In other words, the contact angle 50 may increase as the surface energy of the first surface 36 decreases. In addition, as the contact angle 50 increases, the first surface 36 may become comparatively less wettable and more hydrophobic. Since the self-cleaning film 34 has the texture 66 defined by the plurality of microstructures 68 and the plurality of nanostructures 70, the self-cleaning film 34 may define the contact angle 50 with water of greater than 140°, e.g., greater than 150°, and the first surface 36 may therefore be both superoleophobic and superhydrophobic.

Figure 5:
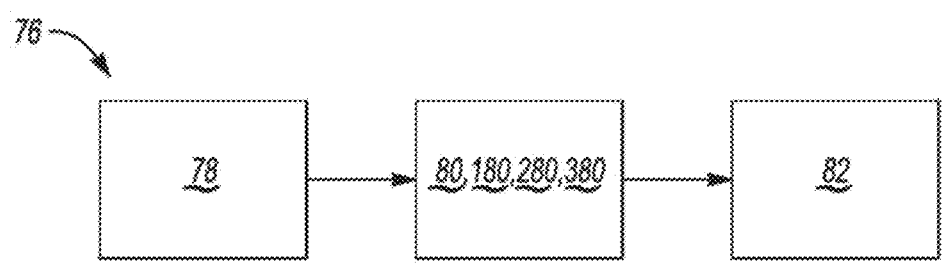
FIG. 5 is a schematic illustration of a method of forming the self-cleaning film system of FIGS. 1 and 3.

Referring now to FIG. 5, a method 76 of forming the self-cleaning film system 10, 110 includes depositing 78 the anti-reflection film 16 onto the substrate 12. More specifically, depositing 78 the anti-reflection film 16 may include magnetron sputtering 80 the first sheet 18 (FIG. 2) formed from titanium dioxide, magnetron sputtering 180 the second sheet 20 (FIG. 2) formed from silicon dioxide onto the first sheet 18, and magnetron sputtering 280 the third sheet 22 (FIG. 2) formed from titanium dioxide onto the second sheet 20. In another embodiment, depositing 78 may also include magnetron sputtering the fourth sheet 24 formed from silicon dioxide onto the third sheet 22. Magnetron sputtering 80, 180, 280 may include accumulating the first, second, and third sheets 18, 20, 22 using rotary or planar targets. Depositing 78 the anti-reflection film 16 may form alternating sheets 18, 20, 22 as shown in FIG. 2.

The method 76 further includes magnetron sputtering 380 the self-cleaning film 34 on the anti-reflection film 16. Magnetron sputtering 380 may include disposing the fluorinated material 56 onto the anti-reflection film 16 using, for example, a carbon target and a polytetrafluoroethylene target. In particular, the method 76 may include disposing the fluorinated material 56 selected from the group consisting of fluorinated organic compounds, fluorinated inorganic compounds, and combinations thereof onto the anti-reflection film 16. For example, the method 76 may include disposing fluorinated diamond-like carbon onto the anti-reflection film 16. Alternatively, the method 76 may include disposing fluorinated tin (IV) oxide onto the anti-reflection film 16. The fluorinated material 56 may be magnetron sputtered onto the first layer 18 in a suitable manner. For example, magnetron sputtering 380 may be reactive using a planar target or a rotary target.

After magnetron sputtering 80, the method 76 also includes reactive ion etching 82 the self-cleaning film with SF$_6$—O$_2$ gas to produce the texture 66 (FIG. 4) defined by the plurality of microstructures 68 spaced apart from one another along the monolayer 58 and the plurality of nanostructures 70 disposed on each of the plurality of microstructures 68. Reactive ion etching 82 may include varying and optimizing one or more of a relative flow rate of SF$_6$ gas and O$_2$ gas, a pressure, and an etch time to obtain the plurality of microstructures having the generally conical shape, the first height 72 of about 1 µm, and a cone angle of about 50°. More specifically, reactive ion etching 82 may include forming each of the plurality of microstructures 68 to have the conical shape 84 and the first height 72 of from 0.5 µm to 2 µm, and forming each of the plurality of nanostructures 70 to have the second height 74 of from 1 nm to 4 nm. Further, reactive ion etching 82 may include minimizing a deposition energy during magnetron sputtering 80.

During use of the self-cleaning film system 10, 110, an operator may deposit fingerprints, squalene, organic matter, and/or oils onto the first surface 36 (FIG. 2). Oils may include oils of fatty acids and may be synthesized naturally and applied to first surface 36 as the operator touches the first surface 36, or may be applied to the first surface 36 artificially such as by spraying or coating.

Contact between the squalene, the photocatalytic material 54 which is exposed to electromagnetic radiation emitted by a light source having a wavelength of less than 357 nm, and water may initiate formation of radicals. The radicals may then react with hydrocarbon debris. More specifically, the photocatalytic material 54 may be a photocatalyst such as titanium dioxide. A photocatalytic reaction may create a strong oxidation agent and breakdown the organic matter, e.g., squalene, to low chain hydrocarbon to carbon dioxide and water in the presence of the photocatalyst, i.e., the photocatalytic material 54; electromagnetic radiation, e.g., ultraviolet light; and water, e.g., humidity from ambient conditions. As such, the photocatalytic material 54 may not be consumed by the catalytic reaction, but may instead solely accelerate the photocatalytic reaction as a non-reactant.

In greater detail, when electromagnetic radiation having a desired wavelength illuminates the photocatalytic material 54, an electron from the valence band of the photocatalytic material 54 may promote to the conduction band of the photocatalytic material 54, which in turn may create a hole in the valence band and an excess of negative charge or electron in the conduction band. The hole may assist oxidation and the electron may assist reduction. Generally, the hole may combine with water to produce a hydroxyl radical (.OH). The hole may also react directly with squalene or other organic material to increase an overall self-cleaning efficiency of the self-cleaning film system 10, 110. Similarly, oxygen in the ambient environment surrounding the photocatalytic material 54 may be reduced by the electron to form a superoxide ion (.O$_2$—), which in turn may oxidize the organic material present on the self-cleaning film system 10, 110.

In addition, the hole may become trapped before recombination with the electron. For such situations, the photocatalytic material 54 may be functionalized. For example, titanium dioxide may be doped with, for example, palladium or ruthenium. The palladium or ruthenium may act as an electrocatalyst and may increase a transfer of electrons to oxygen molecules, which may in turn lower the occurrence of the recombination of electrons and holes.

Further, organic material that is present on the fluorinated material 56 rather than in direct contact with the photocatalytic material 54 may be in dynamic equilibrium with the first surface 36 (FIG. 2) and may diffuse toward a comparatively higher-energy location on the self-cleaning film 34, i.e., the photocatalytic material 54. Therefore, the self-cleaning film 34 may diffuse the squalene along the self-cleaning film 34 from the fluorinated material 56 to the photocatalytic material 54. To improve such diffusion, the light source 52 may be tuned to emit electromagnetic radiation having a wavelength that is tuned to a vibration resonance of the squalene and the fluorinated material 56. Such tuning may enable the squalene or fingerprint to wiggle or translate along the fluorinated material 56 to the photocatalytic material 54 where the squalene may undergo the photocatalytic reaction described above. Alternatively or additionally, the self-cleaning film 34 may also be heated, for example by infrared radiation, to further improve diffusion across the fluorinated material 56 towards the photocatalytic material 54.

Once the squalene contacts the photocatalytic material 54, the squalene may be photolyzed into comparatively low vapor pressure-sized pieces or parts, which may vaporize off the self-cleaning film 34 and thereby remove the fingerprint or squalene from the self-cleaning film 34. Therefore, the self-cleaning film 34 may protect the substrate 12 by removing, e.g., oxidizing and vaporizing the fingerprints, squalene, oils, and/or organic material deposited by the touch of an operator. Consequently, the self-cleaning film system 10, 110 may provide excellent aesthetics, cleanliness, and readability for display systems, lenses, sensors, and surfaces.

While the best modes for carrying out the disclosure have been described in detail, those familiar with the art to which this disclosure relates will recognize various alternative designs and embodiments for practicing the disclosure within the scope of the appended claims.

What is claimed is:

1. A self-cleaning film system comprising:
   a substrate;
   an anti-reflection film comprising a plurality of layers and disposed on the substrate; and
   a self-cleaning film disposed on the anti-reflection film, the self-cleaning film comprising a monolayer formed from a fluorinated diamond-like carbon material and a first plurality of regions disposed within the monolayer, wherein each of the first plurality of regions includes a photocatalytic material.

2. The self-cleaning film system of claim 1, wherein the fluorinated diamond-like carbon material has an index of refraction of from about 1.2 to about 1.6.

3. The self-cleaning film system of claim 1, wherein the anti-reflection film comprises a first layer comprising titanium dioxide, a second layer comprising silicon dioxide, and a third layer comprising titanium dioxide, wherein the self-cleaning film is disposed on the third layer.

4. The self-cleaning film system of claim 3, wherein the first layer has a thickness from about 5 nm to about 25 nm, the second layer has a thickness of from about 20 nm to about 45 nm, and the third layer has a thickness of from about 50 nm to about 200 nm.

5. The self-cleaning film system of claim 1, wherein the photocatalytic material is a doped photocatalytic material.

6. The self-cleaning film system of claim 5, wherein the doped photocatalytic material comprises a doped metal oxide.

7. The self-cleaning film system of claim 5, wherein the doped photocatalytic material comprises a metal dopant or a non-metal dopant.

8. The self-cleaning film system of claim 5, wherein the doped photocatalytic material comprises a dopant selected from the group consisting of: chromium, cobalt, copper, vanadium, iron, silver, platinum, molybdenum, lanthanum, niobium, ruthenium, palladium, nitrogen, sulfur, carbon, boron, potassium, iodine, fluorine, and combinations thereof.

9. The self-cleaning film system of claim 1, wherein the photocatalytic material comprises titanium dioxide.

10. The self-cleaning film system of claim 1, wherein the fluorinated diamond-like carbon material defines a textured surface.

11. The self-cleaning film system of claim 10, wherein the textured surface comprises a plurality of microstructures and a plurality of nanostructures.

12. The self-cleaning film system of claim 11, wherein each of the plurality of microstructures has a conical shape and a first height of from about 0.5 μm to about 2 μm and each of the plurality of nanostructures has a second height of from about 1 nm to about 4 nm.

13. A self-cleaning film system comprising:
a substrate;
an anti-reflection film disposed on the substrate; and
a self-cleaning film disposed on the anti-reflection film, the self-cleaning film comprising:
a monolayer formed from a fluorinated diamond-like carbon material; and
a first plurality of regions disposed within the monolayer such that each of the first plurality of regions abuts and is surrounded by the fluorinated diamond-like carbon material, wherein each of the first plurality of regions includes a photocatalytic material.

14. The self-cleaning film system of claim 13, wherein the fluorinated diamond-like carbon material has an index of refraction of from about 1.2 to about 1.6.

15. The self-cleaning film system of claim 13, wherein the anti-reflection film comprises at least three layers.

16. The self-cleaning film system of claim 15, wherein the anti-reflection film comprises a first layer comprising titanium dioxide having a thickness from about 5 nm to about 25 nm, a second layer comprising silicon dioxide having a thickness from about 20 nm to about 45 nm, and a third layer comprising titanium dioxide having a thickness from about 50 nm to about 200 nm, wherein the self-cleaning film is disposed on the third layer.

17. The self-cleaning film system of claim 13, wherein the photocatalytic material is a doped photocatalytic material.

18. The self-cleaning film system of claim 13, wherein the photocatalytic material comprises titanium dioxide.

19. A self-cleaning film system comprising:
a substrate; and
an anti-reflection film disposed on the substrate and including:
a first layer comprising titanium dioxide;
a second layer comprising silicon dioxide and disposed on the first layer; and
a third layer comprising titanium dioxide and disposed on the second layer;
a self-cleaning film disposed on the third layer of the anti-reflection film, the self-cleaning film comprising:
a monolayer formed from a fluorinated diamond-like carbon material having a surface texture defined by a plurality of microstructures spaced apart from one another and a plurality of nanostructures disposed on each of the plurality of microstructures; and
a first plurality of regions disposed within the monolayer such that each of the first plurality of regions abuts and is surrounded by the fluorinated diamond-like carbon material, wherein each of the first plurality of regions includes a photocatalytic material.

20. The self-cleaning film system of claim 19, wherein each of the plurality of microstructures has a conical shape and a first height of from about 0.5 μm to about 2 μm and further wherein each of the plurality of nanostructures has a second height of from about 1 nm to about 4 nm.

* * * * *